United States Patent [19]
Mishio et al.

[11] Patent Number: 5,986,327
[45] Date of Patent: Nov. 16, 1999

[54] BIPOLAR TYPE DIODE

[75] Inventors: Kouichi Mishio, Yokohama; Satoshi Takahashi, Kawasaki; Shigeru Komatsu, Kamakura, all of Japan

[73] Assignee: Kabushiki Kaisha Toshiba, Kawasaki, Japan

[21] Appl. No.: 08/173,953

[22] Filed: Dec. 28, 1993

Related U.S. Application Data

[63] Continuation of application No. 07/720,831, Sep. 16, 1991, abandoned.

[30] Foreign Application Priority Data

Nov. 15, 1989 [JP] Japan ..................................... 1-296727
Nov. 15, 1990 [WO] WIPO ....................... PCT/JP90/01490

[51] Int. Cl.$^6$ ........................ H01L 29/861; H01L 31/107
[52] U.S. Cl. ........................... 257/606; 257/551; 257/603
[58] Field of Search ............................... 357/13; 257/199, 257/551, 603, 606

[56] References Cited

U.S. PATENT DOCUMENTS

| | | | |
|---|---|---|---|
| 4,672,403 | 6/1987 | Jennings | ................................. 257/606 |
| 4,732,866 | 3/1988 | Chruma et al. | ......................... 438/530 |

FOREIGN PATENT DOCUMENTS

| | | |
|---|---|---|
| 48-29380 | 4/1973 | Japan . |
| 55-103773 | 8/1980 | Japan . |
| 56-36171 | 4/1981 | Japan . |
| 58-80875 | 5/1983 | Japan . |
| 60-229376 | 11/1985 | Japan . |
| 60-233864 | 11/1985 | Japan . |

*Primary Examiner*—Mahshid Saadat
*Assistant Examiner*—George C. Eckert, II
*Attorney, Agent, or Firm*—Finnegan, Henderson, Farabow, Garrett & Dunner, L.L.P.

[57] ABSTRACT

A base region is formed at a shallow junction and an impurity region of higher impurity concentration is formed, by a separate step, as a buried layer at a predetermined distance from the surface of a semiconductor substrate. By so doing, a bipolar diode is implemented which does not involve an increase in a base resistance even if conduction is effected over a longer period of time.

4 Claims, 6 Drawing Sheets

BIPOLAR TYPE DIODE

This application is a continuation of application Ser. No. 07/720,831, filed Sep. 16, 1991, now abandoned.

FIELD OF THE INVENTION

The present invention relates to a breakdown type bipolar diode incorporated in an integrated circuit and, in particular, to a bipolar diode suitable for a highspeed- or a microstructure-type IC device having a shallow junction.

DESCRIPTION OF THE RELATED ART

Figure 1:
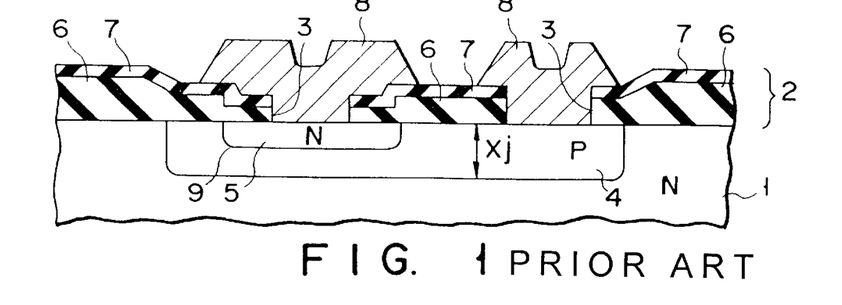
FIG. 1 is a cross-sectional view showing a conventional breakdown type bipolar diode.

FIG. 1 is a cross-sectional view showing a conventional breakdown type bipolar diode. An N type silicon substrate 1 is provided by depositing an epitaxial growth layer containing a phosphorus (P) of about $10^{16}/cm^3$, that is, 1.5 to 2 $\Omega\cdot cm$, on the P type silicon semiconductor substrate of about 25 $\Omega\cdot cm$. A base region 4 of P type (hereinafter referred to as second conductivity type) and emitter region 5 of N type are provided in the surface portion of the semiconductor substrate 1. An insulating layer 2 covers the surface of the semiconductor substrate 1 of N type (hereinafter referred to as first conductivity type). The insulating layer 2 is provided by covering a thermal oxidation film 6 on the surface of the semiconductor substrate 1, depositing, if required, a CVD (Chemical vapor Deposition) layer on the thermal oxidation film 6, not shown, and depositing a silicon nitride 7 by an LPCVD (Low Pressure Chemical vapor Deposition) on a resultant structure to a thickness of about 0.1 $\mu m$. The insulating layer 2 is removed by a PEP (Photo-Engraving Process) at predetermined areas to provide windows 3. The ends of a junction 9 between the base and emmitter regions 4 and 5 exposed on the surface of the semiconductor substrate are protectively covered with the insulating layer 2. An aluminum or aluminum alloy is deposited, by a vacuum evaporation or a sputtering method, on those windows 3 corresponding to the base and emitter regions 4 and 5 to provide electrodes 8.

Figure 2A:
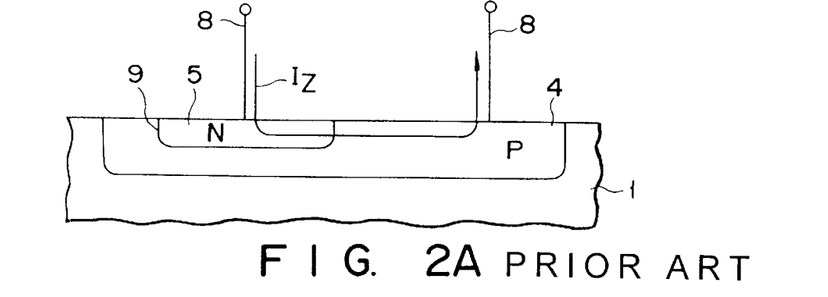
FIGS. 2(A), 2(B) and 2(C) are cross-sectional views for explaining an operative state of a bipolar diode shown in FIG. 1
Figure 2B:
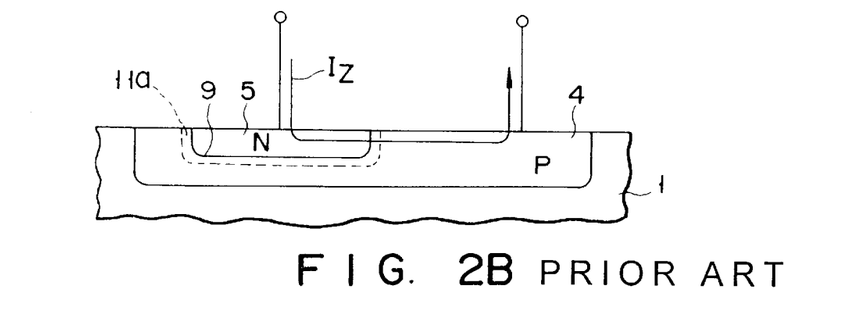
Figure 2C:
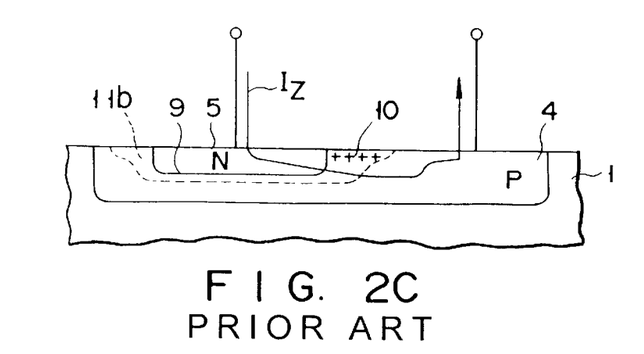
Figure 2D:
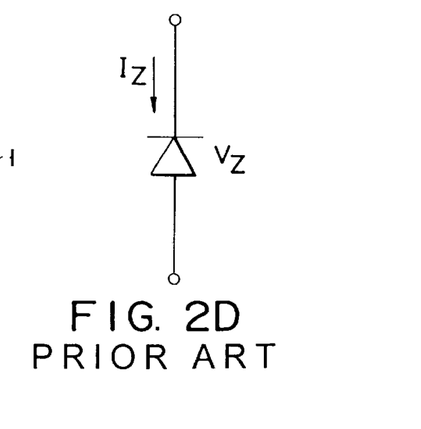
FIG. 2(D) is a schematic representation of the diode of FIG. 1 including the current direction which causes breakdown.

When a current $I_Z$ exceeding a diode breakdown voltage $V_Z$ (see FIG. 2(D)) is supplied to a diode junction of the breakdown type bipolar diode as shown in FIG. 2(A), a depletion layer 11a is created between the base region and the emitter region 5 as shown in FIG. 2(B). In an initial operation state, the breakdown current $I_Z$ flows in the neighborhood of the surface of the semiconductor substrate 1 where the highest base concentration is involved. When the electric current $I_Z$ exceeding the breakdown voltage $V_Z$ flows, an avalanche breakdown occurs at the base-to-emitter junction 9, causing an abrupt flow of the current $I_Z$. For this reason, hot carriers are injected into the insulating layer 2 at those areas near the base-to-emitter junction 9. Since electrons are greater in mobility than holes in the insulating layer 2, positive charges (holes) 10 are stored in the insulating layer 2 as shown in FIG. 2(C). A depletion layer 11b extends along the surface of the base region 4 due to the presence of the stored holes. In this state, the current $I_Z$ flows in the semiconductor substrate 1 in the neighborhood of the base-to-emitter junction 9 with the presence of the holes 10 in the depletion layer 11b as shown in Fig. (C).

Figure 3:
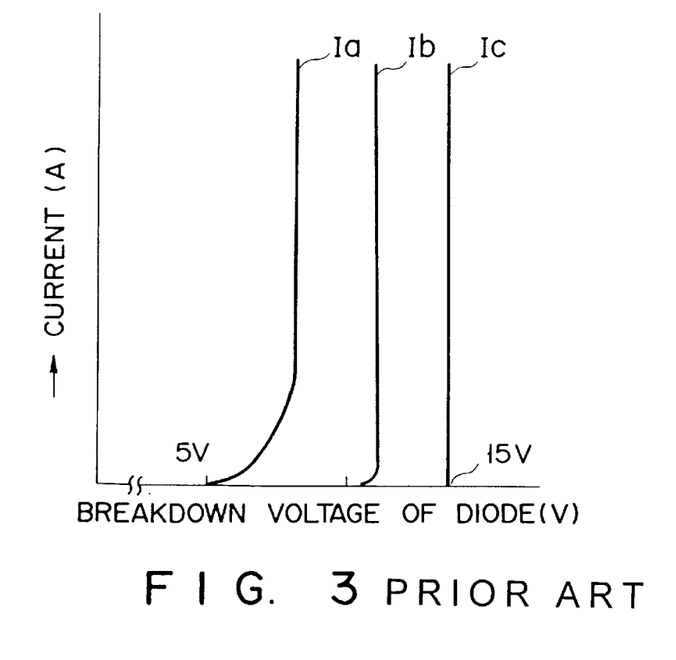
FIG. 3 is a diagram showing a breakdown characteristic involved between the base and the emitter of a breakdown type bipolar diode.

FIG. 3 is a characteristic diagram showing a breakdown characteristic created across the base-to-emitter circuit of the breakdown type bipolar diode. The diode breakdown voltage $V_S$-current curves Ia, Ib, Ic are determined by the impurity concentration of the base at the base-to-emitter junction. In FIG. 3, the curve Ia represents a zener breakdown; the curve Ib, a breakdown of a device (see FIG. 8) using a deep $N^+$ isolation layer; and the curve Ic, an avalanche breakdown. The breakdown value is so set that its center value falls within a range of 0.5 to 7.0 V, a range readily usable from a normal circuit configuration, and is controlled with an accuracy of the order of ±0.1 to 0.3 V.

Figure 4:
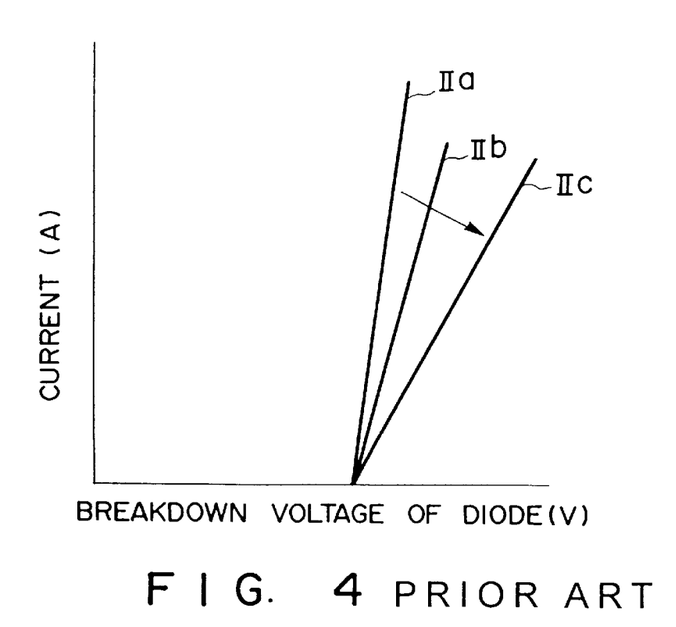
FIG. 4 is a diagram showing a resistance characteristic of the breakdown type bipolar diode.

FIG. 4 is a characteristic diagram showing the resistive characteristic of the breakdown type bipolar diode. Upon flow of the current $I_Z$ in the diode shown in FIG. 1, a current path is moved from the surface of the semiconductor substrate 1 toward an inside but, due to the impurity concentration of the base region 4 being lower than that of the surface of the semiconductor substrate 1, the resistive value at the current path is high. With the passage of the time after conduction, the resistive value increases because of accumulated holes involved. As shown in FIG. 4, it has been found that the diode breakdown voltage Vs-current characteristic varies from a line IIa to a line IIb and from there to a line IIc. The line IIa represents an initial state; the line IIb, a state following the initial state; and the line IIc, a state following the passage of the time after conduction.

Figure 5:
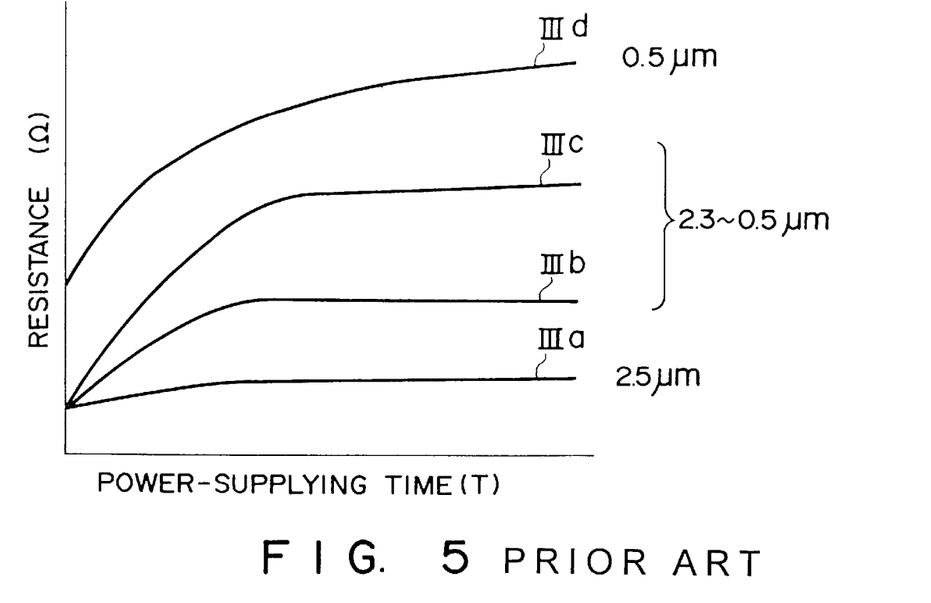
FIG. 5 is a characteristic diagram showing an ON time-to-resistance relation of the breakdown type bipolar diode.

FIG. 5 is a characteristic diagram showing a conduction time-to-resistive value relation of the breakdown type bipolar diode. The curve IIIa shows a base-to-emitter junction of a low-frequency transistor having a junction depth Xj of 2.5 $\mu m$ at the junction of the base region 4 and a sheet resistivity of 170 $\Omega/B$. Even if the current path enters the inside of the semiconductor substrate due to the effect of the charges injected in the insulating layer 2 at an area near the junction, the base concentration does not extremely fall because the greater junction depth Xj of the base region 4. For this reason, a small variation of the resistive value is involved with the passage of time. The curves IIIb and IIIc show those transistors having a junction depth Xj of 2.3 to 0.5 $\mu m$ and a sheet resistivity of 500 $\Omega/B$, the former being the case where the silicon nitride layer 7 is not used and the latter being the case where the silicon nitride layer 7 is used. The curve IIId shows a transistor having a junction depth Xj of 0.5 $\mu m$ and a sheet resistivity of 1.5 $\Omega/B$. In the case of the curve IIId, since the junction depth Xj of the base region 4 is as shallow as 0.5 $\mu m$ and there is a greater variation in the depth of an impurity, the path of the current $I_Z$ moves into the base region 4 due to the effect of the depletion layer 11b so that a resistive value involved is increased. Thus a greater variation is involved for the curve IIId than for the curve IIIb because the base impurity concentration is as low as 1/3, that is, the sheet resistivity is three times as high. In the curve IIIc, the probability of hot charges being trapped becomes high due to the presence of the silicon nitride layer 7 and a great amount of charge is built up at the insulating layer 2 in the neighborhood of the junction, causing a greater change in the broadening of the depletion layer 11b. Though depending upon the conduction requirement, the charge in the insulating layer 2 is saturated if there occurs a uniformity between the charging and the discharging. This phenomenon is a mode of recovery upon heating when the conduction is stopped.

From a Gummel plot obtained upon evaluation as a transistor structure, it has been confirmed that there occurs a resistance in the base region.

Figure 6:
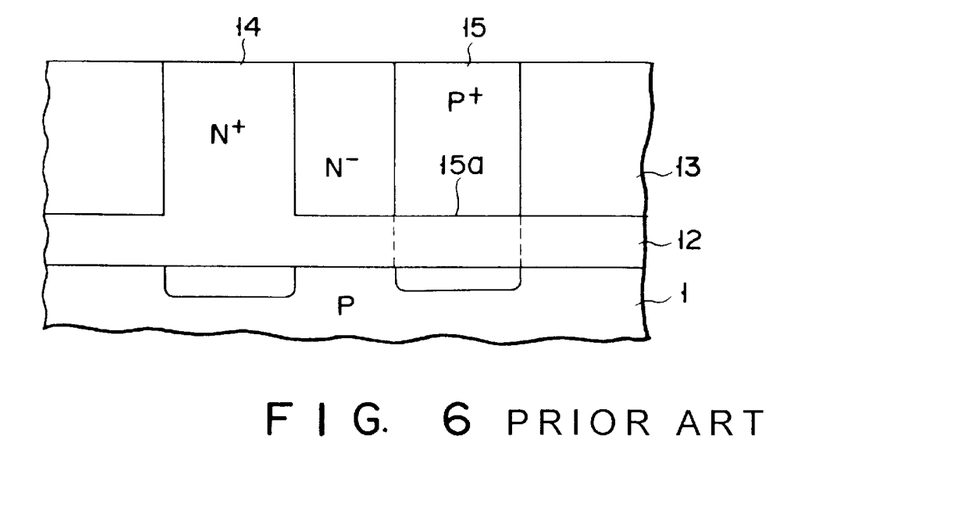
FIGS. 6 to 8 are cross-sectional views showing a conventional improved breakdown type bipolar diode.
Figure 7:
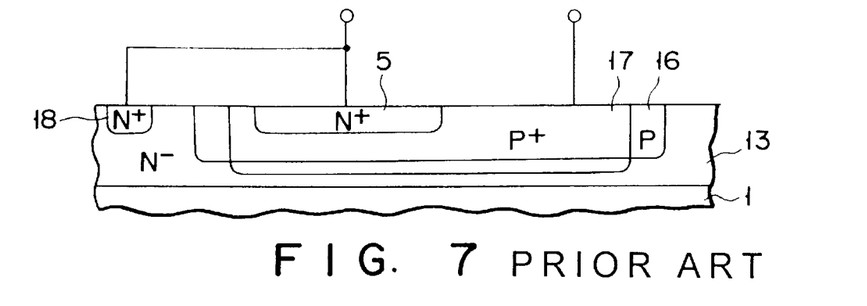
Figure 8:
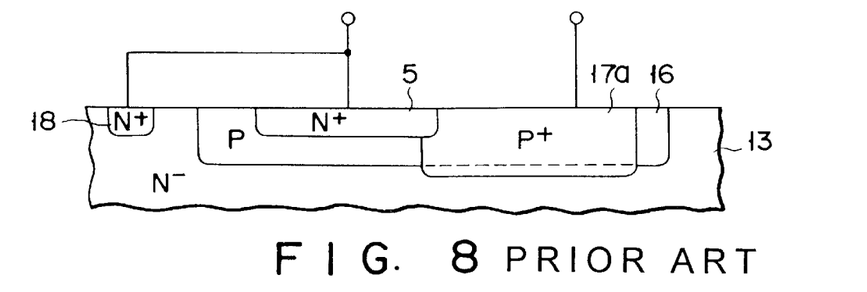

FIGS. 6 to 8 are cross-sectional views showing a conventional breakdown type bipolar diode for preventing an increase in the resistance of a respective base region.

In the diode shown in FIG. 6, an avalanche breakdown occurs at a junction 15a between an $N^+$ buried region 12 and the $P^+$ layer 15. Antimony of about $10^{18}/cm^3$ is diffused into a P type silicon semiconductor substrate 1 of about 25 $\Omega\cdot cm$ to provide an $N^+$ buried region 12, an $N^-$ epitaxial layer 13 containing a P of about $10^{16}/cm^3$ is deposited to a thickness of 4 μm to provide a deep $N^+$ region 14 containing the phosphorus of $10^{18}/cm^3$ over the substrate 1, and a $P^+$ layer is then formed over the buried region 12 which contains a B of $10^{17\ to\ 18}/cm^3$.

In the diode shown in FIG. 7, an emitter region 5 and base region 4 are formed over a silicon semiconductor substrate 1, the concentrations of the emitter and base regions having the same level as those in FIG. 1 but, here, an internal base region 16 and external base region 17 are formed over the substrate, an aspect which is different from that shown in FIG. 1. Further, a phosphorus (P) of about $10^{20}/cm^3$ is diffused to provide a collector contact 18. The internal base region 16 has a junction depth Xj of 0.5 to 0.6 μm and concentration of $10^{17}/cm^3$ and the external base region 17 has a junction depth Xj of 0.7 to 0.8 μm and concentration of $10^{18}/cm^3$.

In the diode shown in FIG. 8, an external base region 17a is provided in a way different from that shown in FIG. 7. In the diode in FIG. 6 which utilizes, as the junction depth Xj, a greater depth of a junction between the $N^+$ buried region 12 and the $P^+$ layer 15, it is difficult to control the breakdown voltage value of the diode with an $N^+/P^+$ concentration. A difficulty is also encountered in conjunction with the temperature coefficient against the resistance of the $P^+$ layer 15. In this case, the breakdown voltage of the zener diode has a temperature coefficient as high as 3 mV/°C. In the diodes shown in FIGS. 7 and 8, a resistance increase resulting from the broadening of the depletion layer 11 in the internal base region 16 is suppressed through the utilization of the external base region 17 with a greater junction depth as the junction depth Xj, but not adequately.

In an IC device utilizing a smaller junction as the junction depth Xj, if use is made of a breakdown (potential clamping) type diode for breaking down the base-to-emitter junction, the internal resistance increases with a lapse of time, causing a failure in the electrical performance of the circuit involved and hence a lowering in the reliability of the IC element.

It is accordingly the object of the present invention to provide a breakdown type bipolar diode which, even if the broadening of a depletion layer pushes a current path down into a base region with hot carriers injected into an insulating layer in the neighborhood of a junction, can prevent an increase in a base resistance.

DISCLOSURE OF INVENTION

According to the present invention there is provided a bipolar diode comprising: a semiconductor substrate of first conductivity type; an impurity region of the first conductivity type formed in a surface portion of the semiconductor substrate; a first impurity region of second conductivity type formed in the surface portion of the semiconductor substrate in a manner to contact with the impurity region of the first conductivity type; a second impurity region of the second conductivity type formed in contact with the impurity region of the first conductivity type and first impurity region at a predetermined distance from the surface of the semiconductor substrate toward an inside of the substrate, the second impurity region being higher in impurity concentration than the first impurity region; and an insulating layer formed over the surface of the semiconductor substrate to protect a junction end of the associated regions.

In another embodiment of the present invention, a bipolar diode is provided which comprises: a semiconductor substrate of first conductivity type; an impurity region of the first conductivity type formed in a surface portion of the semiconductor substrate; a first impurity region of second conductivity type formed inside the semiconductor substrate at a predetermined distance from the surface of the semiconductor substrate; a second impurity region of the second conductivity type formed inside the semiconductor substrate from the substrate surface in a manner to contact with the first impurity region and isolated from the impurity region of the first conductivity type, the second impurity region having a higher impurity concentration; and an insulating layer formed over the semiconductor substrate and protecting a junction end of the associated regions.

In another embodiment of the present invention, a bipolar diode is provided which comprises: a semiconductor substrate of first conductivity type; an impurity region of the first conductivity type formed in a surface portion of the semiconductor substrate; a first impurity region of second conductivity type formed in the surface portion of the semiconductor substrate in a manner to contact with the impurity region of the first conductivity type; a second impurity region of the second conductivity formed inside the semiconductor substrate at a predetermined distance from the surface of the semiconductor substrate in a manner to contact with the impurity region of the first conductivity type and first impurity region, the second impurity region being higher in impurity concentration than the first impurity region; a third impurity region of the second conductivity type formed in the surface portion of the semiconductor substrate in a manner to contact with the first and second impurity regions, the third impurity region having a higher impurity concentration; and an insulating layer formed over the surface of the semiconductor substrate to protect a junction end of the associated regions.

In another embodiment of the present invention, there is provided a bipolar diode is provided which comprises: a semiconductor substrate of first conductivity type; an impurity region of the first conductivity type formed in a surface portion of the semiconductor substrate; a first impurity region of second conductivity type formed inside the semiconductor substrate at a predetermined distance from the surface of the semiconductor substrate, the first impurity region having a high impurity concentration; a second impurity region of the second conductivity type formed in the surface portion of the semiconductor substrate in a manner to contact with the impurity region of the first conductivity type and first impurity region; and an insulating layer formed over the surface of the semiconductor substrate to protect a junction end of the associated regions.

Further, the bipolar diode is characterized in that the insulating layer contains a silicon nitride.

In the bipolar zener diode of the present invention, an impurity region of a maximal impurity concentration is provided at a predetermined distance from the surface of the semiconductor substrate by a step other than a step by which a base is formed with a shallow junction. A base region with a normal junction depth as Xj needs to be cautiously formed so as to avoid a crystal defect at the emitter-to-collector portion of a transistor. At the impurity region of a maximal impurity concentration at the predetermined distance from the surface of the semiconductor substrate, that is, at the buried base region, a double junction (an emitter/base/collector area) is relatively free from any crystal defect. A junction may be preferably provided at an area between the emitter and the base and between the base and the collector because of the common use of a short-circuiting between the collector and the emitter. Thus, a larger acceleration energy dose can be set when an impurity is introduced by an ion implanting method so that a buried base region may be provided.

BEST MODE OF CARRYING OUT THE INVENTION

Bipolar diodes according to embodiments of the present invention will be explained below with reference to accompanying drawings.

Zener diodes of the present invention monolithically formed as bipolar IC devices (see FIG. 14) will be explained below with reference to FIGS. 9 to 13. The bipolar IC device and bi-MOS type composite device are employed as a type utilizing a silicon nitride layer which is excellent in passivation characteristic over, for example, a silicon oxide layer. As the silicon nitride layer use may be made of one whose stoichiometric ratio is not fixed but somewhat deviated therefrom. Further, use may also be made of a mixture consisting principally of an oxy-chloride or containing the oxychloride.

The silicon nitride layer excellent in passivation characteristic has been formed on a silicon oxide layer usually overlying a semiconductor substrate surface or it has been common practice to simultaneously form these layers over the substrate from the standpoint of manufacturing individual active or passive IC elements at less number of steps. IC circuit devices using the so-called shallow junction type to provide a high-speed performance are commercially available in greater number. The silicon nitride layer has such a property that hot carriers can be readily trapped. In order to obtain an excellent high-speed performance IC device with a zener diode monolithically formed there, a zener diode of a special structure is necessary.

Figure 9:
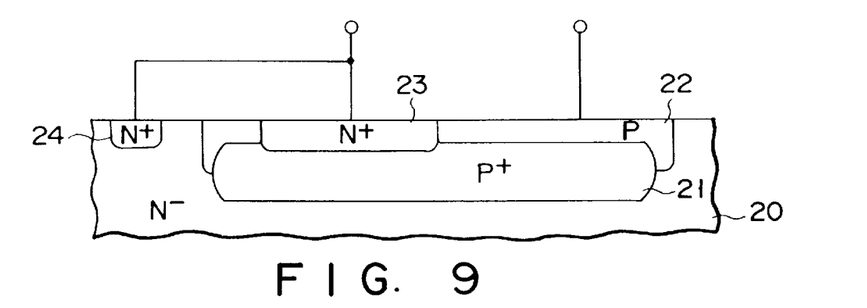
FIG. 9 is a cross-sectional view showing a bipolar diode according to a first embodiment of the present invention.
Figure 13:
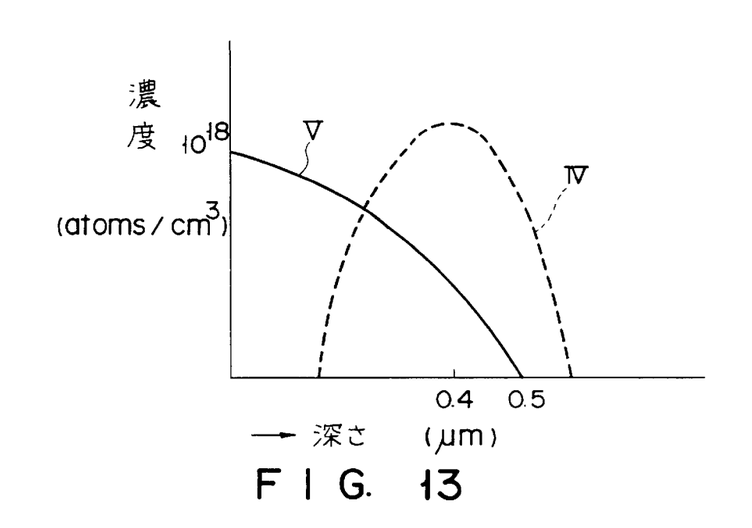
FIG. 13 is a graph showing a junction depth-to-impurity concentration characteristic in the embodiment shown in FIG. 9.
Figure 14:
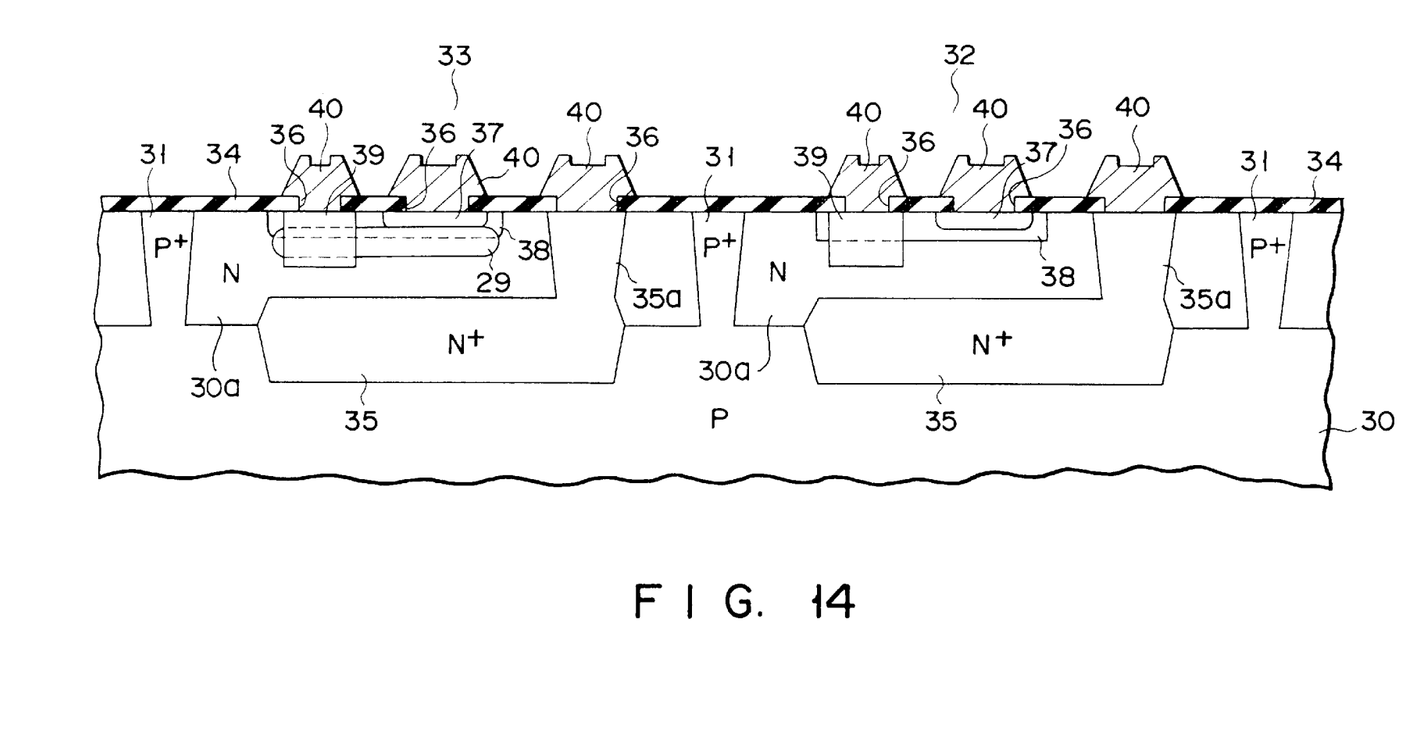
FIG. 14 is a cross-sectional view showing a major section of a bipolar type IC device with a bipolar diode incorporated therein.

FIG. 9 is a cross-sectional view showing a bipolar diode according to a first embodiment of the present invention. An N type epitaxial layer 20 of 1.5 to 2 Ω•cm, that is, a layer containing about $10^{16}/cm^3$ of phosphorus, is deposited on a silicon semiconductor substrate of about 25 Ω•cm, not shown. Isolation areas, not shown, are formed by a diffusion, a selective oxidation or other proper methods on the N type silicon epitaxial layer 20 to provide island areas, not shown. A silicon dioxide, not shown, corresponding to an insulating layer 34 in FIG. 14, is covered on the resultant structure surface. A P type impurity B is diffused by an ion implantation method in the structure through the silicon dioxide layer to form an internal base region 22 with an impurity concentration peak substantially equal to that of a P+ buried region 21. The buried region 21 and internal base region 22 of the second conductivity type are formed simultaneously. The buried region 21 and internal base region 22 are formed with a concentration (dose) and junction depth Xj (acceleration voltage) as shown in FIG. 13. In FIG. 13, the curve IV shows a junction depth-to-concentration relation of the buried region 21 and the curve V shows a junction depth-to-concentration relation of the internal base region 22. The peak values of the concentrations of both the curves are represented as $10^{18}/cm^3$, but the concentration peak is 0.4 μm in depth for the buried region 21 and at a surface for the internal base region 22. The buried region 21 is formed at a predetermined distance from the surface of the semiconductor substrate. The junction depth Xj is 0.3 to 0.6 μm for the buried region 21 and 0.0 to 0.5 μm for the internal base region 22. Then an emitter region 23 of second conductivity type is provided through the ion implantation of about $10^{20}/cm^3$ of arsenic and through the diffusion step to a junction depth Xj of about 0.2 μm. A phosphorus (P) is introduced to such an extent as to obtain an ohmic contact as a collector contact to provide a collector contact 24. As shown in FIG. 9, the bottom of an emitter region 23 contacts with the upper portion of the buried region 21.

Figure 10:
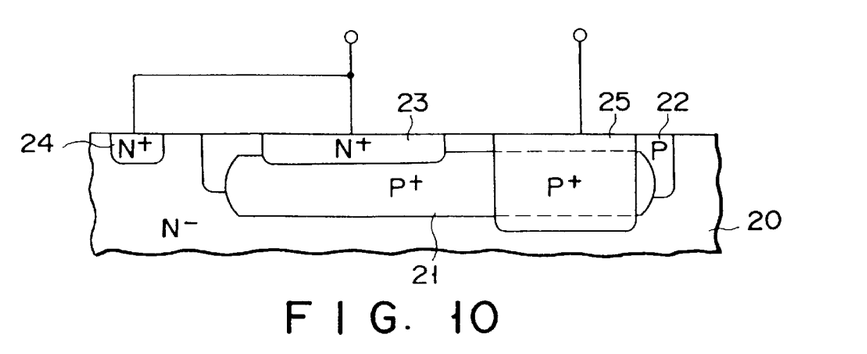
FIG. 10 is a cross-sectional view showing a bipolar diode according to a second embodiment of the present invention.

FIG. 10 is a cross-sectional view showing a bipolar diode according to a second embodiment of the present invention. In FIG. 10, a base contact 25 corresponding to an external base region of a base region 22 is added to the arrangement shown in FIG. 9. The junction depth Xj of the base contact 25 is at the deepest, that is, about 0.9 μm and the maximum impurity concentration is of the order of $10^{19}/cm^3$.

Figure 11:
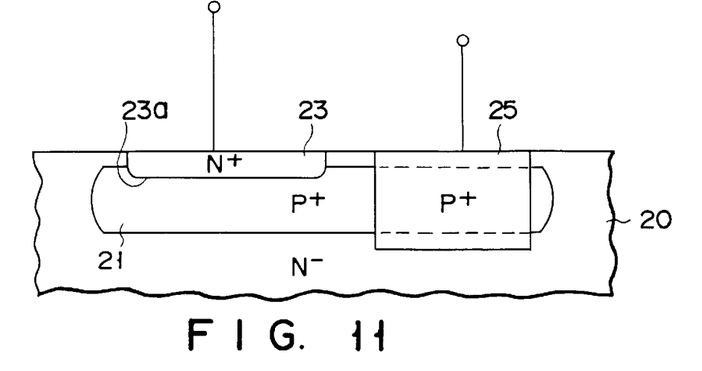
FIG. 11 is a cross-sectional view showing a bipolar diode according to a third embodiment of the present invention.

FIG. 11 is a cross-section view showing a bipolar diode according to a third embodiment of the present invention. This embodiment is of a low noise type with the internal base region 22 omitted. A junction breakdown occurs at a junction area 23a of a buried region 21 and emitter region 23. Since there is no internal base 22 between an epitaxial layer 20 and the emitter region 23, short-circuiting occurs immediately across the epitaxial layer 20 and the emitter region 23 due to the occurrence of a breakdown. A base contact 25 is provided because of an absence of the internal base region 22.

Figure 12:
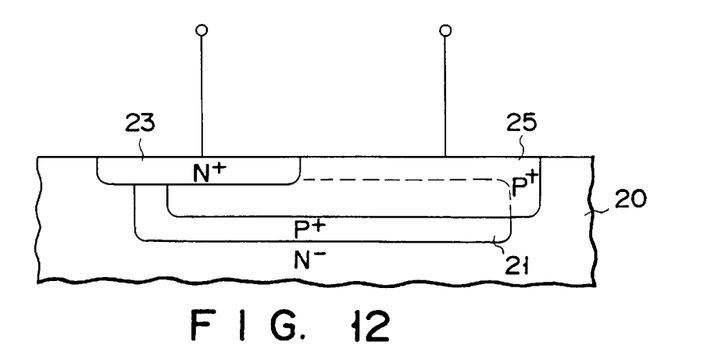
FIG. 12 is a cross-sectional view showing a bipolar diode according to a fourth embodiment of the present invention.

FIG. 12 is a cross-sectional view showing a bipolar diode according to a fourth embodiment of the present invention. In the fourth embodiment, the collector contact 24 and emitter region 23 shown in FIG. 9 are formed as one unit to provide an emitter region 23. A base contact 25 is also provided in the fourth embodiment.

The junction breakdown of the zener diode is determined depending upon the trade-off of the emitter region 23, buried region 21 and internal base region 22. It normally occurs in the neighborhood of the surface of a semiconductor substrate of a high concentration contact. However, the junction breakdown moves toward the inside of the semiconductor substrate as the profile of the depletion layer is enlarged. According to the present zener diode, on the other hand, no drawback occurs, such as a variation in the internal resistance value of the base region because the resistive value of the buried region 21 is adequately lower.

FIG. 14 is a cross-sectional view showing a major section of a bipolar IC device incorporating the aforementioned zener diode therein. Island areas are formed in an N type epitaxial layer 30a of a P type polysilicon semiconductor substrate 30 in a manner to be isolated by P type isolation areas 31. An NPN transistor 32 and zener diode 33 are formed in and on the island area. $N^+$ collector buried layers 35 are provided in those areas of the substrate. A $P^+$ buried region 29 is provided in the zener diode 33. The aforementioned insulating layer 34 for covering the surface of the island area is formed of a silicon nitride layer and silicon oxide layer as set out above. Not only emitter regions 37 and internal base regions 38 but also external base regions 39 are provided via corresponding windows 36 in the insulating layer 34. A conductive metal layer of an Al-based alloy 40, as Al-Si-Cu or Al-Si, is deposited as an electrode on the resultant structure surface in a manner to straddle the corresponding openings 36 with the conductive metal layer 40 connected to each corresponding region. A deep $N^+$ region 35a is connected to each $N^+$ buried layer 35 and serves also as a collector contact. The emitter region 37, internal base region 38 and external base region 39 are equal in concentration to those of the aforementioned zener diode of the present invention.

INDUSTRIAL APPLICABILITY

As set out above, the present invention is directed to a bipolar diode with a shallow impurity profile there but the present bipolar diode can gain an amount of resistance change substantially equal to a zener diode with a deeper junction depth as Xj in terms of a conduction time/resistive value relation, thus obtaining a better result.

We claim:

1. A bipolar diode comprising:

an epitaxial layer of a first conductivity type formed on a semiconductor substrate of a second conductivity type;

an impurity region of the first conductivity type formed in a surface portion of the epitaxial layer;

a first impurity region of the second conductivity type formed in the surface portion of the epitaxial layer in a manner to contact with the impurity region of the first conductivity type;

a second impurity region of the second conductivity type formed in contact with the impurity region of the first conductivity type and the first impurity region; and an insulating layer formed over the surface of the epitaxial layer to protect a junction end of the associated regions;

wherein said second impurity region is formed in a region shallower than a buried layer of the first conductivity type formed between the epitaxial layer and the semiconductor substrate, the second impurity region having a maximal impurity concentration at a predetermined distance from the surface of the epitaxial layer toward an inside of the epitaxial layer and being higher in impurity concentration than the first impurity region, and wherein a breakdown of a junction of the impurity region of the first conductivity type and the second impurity region is caused at a location shallower than the buried layer.

2. A bipolar diode comprising:

an epitaxial layer of a first conductivity type formed on a semiconductor substrate of a second conductivity type;

an impurity region of the first conductivity type formed in a surface portion of the epitaxial layer;

a first impurity region of the second conductivity type formed in the surface portion of the epitaxial layer in a manner to contact with the impurity region of the first conductivity type;

a second impurity region of the second conductivity type formed inside the epitaxial layer in a manner to contact with the impurity region of the first conductivity type and the first impurity region;

a third impurity region of the second conductivity type formed in the surface portion of the epitaxial layer in a manner to contact with the first and second impurity regions, the third impurity region having a higher impurity concentration than the second impurity region; and an insulating layer formed over the surface of the epitaxial layer to protect a junction end of the associated regions;

wherein said second impurity region is formed in a region shallower than a buried layer of the first conductivity type formed between the epitaxial layer and the semiconductor substrate, the second impurity region being higher in impurity concentration than the first impurity region and having a maximal impurity concentration at a predetermined distance from the surface of the epitaxial layer, and wherein a breakdown of a junction of the impurity region of the first conductivity type and the second impurity region is caused at a location shallower than the buried layer.

3. A bipolar diode comprising:

an epitaxial layer of a first conductivity type formed on a semiconductor substrate of a second conductivity type;

an impurity region of the first conductivity type formed in a surface portion of the epitaxial layer;

a first impurity region of the second conductivity type formed in contact with the impurity region of the first conductivity type;

a second impurity region of the second conductivity type formed in the surface portion of the epitaxial layer in a manner to contact with the impurity region of the first conductivity type and the first impurity region, the second impurity region having a lower impurity concentration than the first impurity region; and an insulating layer formed over the surface of the epitaxial layer to protect a junction end of the associated regions;

wherein said first impurity region is formed in a region shallower than a buried layer of the first conductivity type formed between the epitaxial layer and the semiconductor substrate, the first impurity region having a maximal impurity concentration at a predetermined distance from the surface of the epitaxial layer, and wherein a breakdown of a junction of the impurity region of the first conductivity type and the first impurity region is caused at a location shallower than the buried layer.

4. The bipolar diode according to claims 1, 2 or 3, wherein said insulating layer includes silicon nitride.

* * * * *